United States Patent [19]

Schutten et al.

[11] 4,323,793

[45] Apr. 6, 1982

[54] THYRISTOR HAVING WIDENED REGION OF TEMPERATURE SENSITIVITY WITH RESPECT TO BREAKOVER VOLTAGE

[75] Inventors: Herman P. Schutten, Milwaukee; Stanley V. Jaskolski, Sussex; Gordon B. Spellman, Mequon, all of Wis.; Robert W. Lade, North Fort Myers, Fla.; Michael J. Schutten, Milwaukee, Wis.

[73] Assignee: Eaton Corporation, Cleveland, Ohio

[21] Appl. No.: 94,074

[22] Filed: Nov. 14, 1979

Related U.S. Application Data

[63] Continuation-in-part of Ser. No. 946,180, Sep. 27, 1978, abandoned.

[51] Int. Cl.³ .................................... H03K 17/72
[52] U.S. Cl. ......................... 307/252 R; 307/252 A; 307/252 J; 307/305; 307/310; 357/28; 357/30
[58] Field of Search ............ 307/252 A, 252 J, 252 N, 307/252 R, 304, 305, 251, 310; 357/28, 30

[56] References Cited

U.S. PATENT DOCUMENTS

| | | | |
|---|---|---|---|
| 3,609,457 | 9/1971 | Squiers | 317/13 C |
| 3,708,720 | 1/1973 | Whitney et al. | 317/13 C |
| 3,812,405 | 5/1974 | Clark | 307/305 X |
| 3,846,674 | 11/1974 | McNulty | 317/13 C |
| 3,891,866 | 6/1975 | Okuhara et al. | 307/252 A |
| 3,920,955 | 11/1975 | Nakata | 219/501 |
| 3,971,056 | 7/1976 | Jaskolski et al. | 357/28 |
| 4,039,863 | 8/1977 | Ohhinata et al. | 307/252 A |
| 4,084,110 | 4/1978 | Okuhara et al. | 307/252 G |
| 4,112,458 | 9/1978 | Jaskolski et al. | 307/310 X |

OTHER PUBLICATIONS

Paul E. Gray et al. "Electronic Principles Physics, Models, and Circuits", Massachusetts Institute of Technology, John Wiley Sons, Inc., 1969, pp. 354-355.

Primary Examiner—John Zazworsky
Attorney, Agent, or Firm—C. H. Grace; M. L. Union

[57] ABSTRACT

An external resistance is presented between the gate and cathode of a thermally sensitive thyristor which varies in accordance with a changing voltage applied across the thyristor. The changing voltage sweeps the varying external resistance through its operating range which in turn expands the region of temperature sensitivity with respect to breakover voltage by sweeping the shifting curves of switching temperature vs. gate to cathode resistance for the thyristor. In preferred form, a field effect transistor (FET) (10) is connected between the gate (8) and cathode (4) of the thermally sensitive thyristor (6) and is biased by the same voltage supply applied across the thyristor. The FET presents an external gate to cathode resistance which varies in accordance with the changing bias level on the FET, which is the same changing bias applied across the thyristor. The range of variance of this added external resistance must be between 10,000 ohms and 1 megohm. The breakover voltage of the thyristor can be made to vary slowly with respect to temperature, rather than exhibiting sharp drop in a narrow critical temperature region.

6 Claims, 8 Drawing Figures

THYRISTOR HAVING WIDENED REGION OF TEMPERATURE SENSITIVITY WITH RESPECT TO BREAKOVER VOLTAGE

CROSS REFERENCE TO RELATED APPLICATION

This application is a continuation-in-part of co-pending application Ser. No. 946,180, filed Sept. 27, 1978, now abandoned.

BACKGROUND OF THE INVENTION

Thermally sensitive thyristors are known which intrinsically switch from a nonconductive off state to a conductive on state in response to temperature. Examples of such thyristors are disclosed in Jaskolski et al U.S. Pat. No. 3,971,056, issued July 20, 1976, and Jaskolski et al U.S. Pat. No. 4,112,458, issued Sept. 5, 1978.

The breakover voltage of these thyristors varies with temperature as shown in FIG. 1 which plots temperature on the horizontal axis and breakover voltage (voltage between the anode and cathode of the thyristor) on the vertical axis. The curve may be determined empirically or may be calculated from the design parameters of electrical base widths, minority carrier lifetimes and relative layer resistivities.

In certain applications it may be desirable to use this known relationship between breakover voltage and temperature to determine the value of one as a function of a sensed or measured value of the other. A steep slope provides extreme accuracy and high resolution of temperature when read by voltage variation. However, a steep slope only affords a narrow range, and in certain applications a wider temperature sensitive region may be desirable or necessary.

It is known that the value of resistance 7, FIG. 2 between the gate and cathode of the thyristor affects the switching temperature (the narrow temperature region in which the breakover voltage drops sharply, FIG. 1). As the resistance decreases, the switching temperature increases, FIG. 3. This known effect has been used in prior thyristors to shift the critical region left or right in FIG. 1. The critical region does not expand, but rather shifts, with the width of the region remaining the same.

A circuit employing a thyristor in combination with a field effect transistor is disclosed in Clark, U.S. Pat. No. 3,812,405, issued May 21, 1974. The transistor used there, however, is a very ordinary field effect transistor, as indicated by the geometric drawings of that patent. Thus the source to drain resistance is in the area of 100 ohms. The result is that again the critical region is not widened, but rather is merely shifted to the left or right.

The present invention deals with widening the region of temperature sensitivity.

SUMMARY OF THE INVENTION

The present invention employs an added external resistance between the gate and cathode of a thermally sensitive thyristor which varies during the operating cycle of the thyristor so as to variably sweep across a family of breakover voltage versus temperature curves representative of individual instantaneous resistance values. Preferably, the resistance varies in response to the cycling operating voltage applied across the thyristor whereby the applied voltage at the time of breakover can be correlated to the external gate to cathode resistance at such voltage which in turn can be correlated to the switching temperature. The value of the external resistance however, must remain within a range between 10 kilohms and 1 megohm.

As the applied voltage changes, a plotted curve of switching temperature vs. gate to cathode resistance shifts along the switching temperature axis to afford the temperature sensitive region of FIG. 1. The present invention provides a changing external gate to cathode resistance which sweeps this curve to thus expand the temperature sensitive region.

DESCRIPTION OF THE PREFERRED EMBODIMENT

Figure 1:
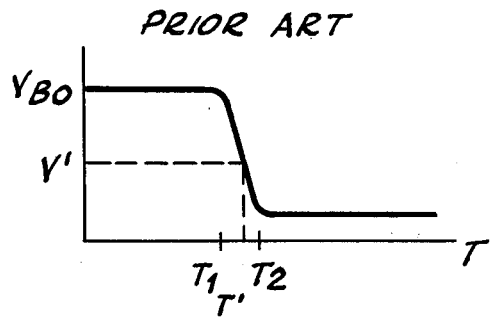
FIG. 1 is a graph of temperature T vs. breakover voltage $V_{BO}$ of prior thermally sensitive thyristors showing the narrow region of temperature sensitivity wherein $V_{BO}$ drops sharply.

Prior thyristors have a breakover voltage $V_{BO}$ which varies with temperature T as shown in FIG. 1. $V_{BO}$ remains substantially constant up to temperature $T_1$ and then changes quite rapidly over the temperature range $T_1$ to $T_2$, this being the critical temperature sensitive region. This is a narrow region because $T_2$ is only slightly greater than $T_1$, and the curve exhibits a steep slope in this region.

Figure 4:
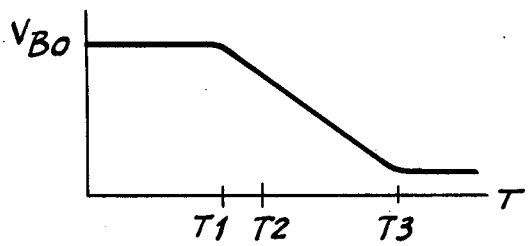
FIG. 4 is a graph of temperature T vs. breakover voltage $V_{BO}$ enabled by the present invention.

In some applications it would be desirable to have the $V_{BO}$ vs. T curve vary slowly with temperature. FIG. 4 shows the $V_{BO}$ vs. T curve for the present invention wherein the critical temperature sensitive region lies in the temperature range $T_1$ to $T_3$, where $T_3 >> T_1$. The slope is more gradual than FIG. 1.

Figure 2:
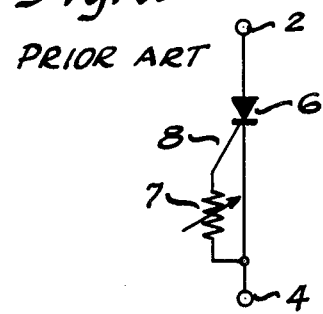
FIG. 2 is a known circuit arrangement of a thermally sensitive thyristor with an adjustable resistance between its gate and cathode.
Figure 3:
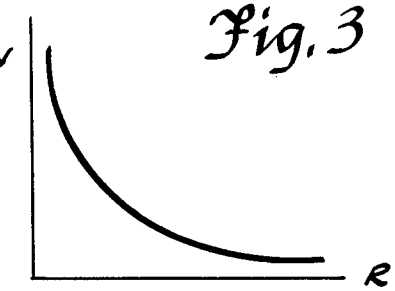
FIG. 3 is a graph of external gate to cathode resistance R vs. switching temperature Tsw for a thermally sensitive thyristor.

The teachings of the present invention are best begun with the known effect on switching temperature Tsw of external resistance between the gate and cathode of a thyristor. Switching temperature Tsw is defined as a value in the critical region at which the thyristor breaks over at a given voltage applied thereacross. For example, if a voltage V', FIG. 1, is applied across the anode 2 and cathode 4 of the thyristor 6, FIG. 2, then the thyristor will intrinsically switch to its conductive state when the temperature rises to the value T', FIG. 1. The added external resistance 7 between the gate 8 and cathode 4 of the thyristor affects Tsw. As external gate to cathode resistance R decreases, the switching temperature Tsw increases, as shown in FIG. 3.

In accordance with the present invention, it has been found that by varying the external gate to cathode resistance during the operating cycle of the thyristor, the critical temperature sensitive region with respect to breakover voltage is widened as shown in FIG. 4. The resistance is preferably varied in accordance with a changing bias level on the thyristor during such cycle, i.e. as the voltage across the thyristor increases during one cycle of the voltage source, the external resistance changes in response thereto. This continuously changing resistance sweeps the thyristor through a family of instantaneous R vs Tsw curves, which in turn sweeps out a broader region of temperature values, FIG. 4, as the voltage is changing because Tsw is changing therewith.

Figure 5:
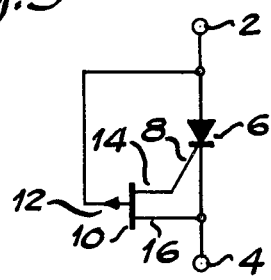
FIG. 5 is a circuit diagram of the preferred embodiment of the present invention.

In the preferred embodiment, FIG. 5, a field effect transistor (FET) 10 is used as the variable or changing external resistance means. FET 10 has its gate 12 connected to the thyristor anode 2, its source 14 connected to the thyristor gate 8, and its drain 16 connected to the thyristor cathode 4. Thus the voltage applied across the thyristor also biases the FET. If, for example, a cyclic ramp voltage is applied across the thyristor, the FET and the thyristor will be swept through their operating ranges during each cycle. The thyristor gate to cathode external resistance R is continuously changing as the bias level on the FET changes, thereby continuously changing Tsw with respect to $V_{BO}$ and hence widening the temperature sensitive region of the thyristor.

The external resistance being applied between the gate and the cathode of the thyristor is thus the internal source to drain resistance of the FET. The source to drain resistance of a common FET, however, is too low to be effective, since it normally is in the range of 100 ohms. Required to widen the temperature sensitive region of the thyristor significantly is an external resistance varying between 10 kilohms and 1 megohm. The FET required to be connected between the gate and cathode of the thyristor therefore must have a source to drain resistance in this latter range. The fact that this high resistance results in a transistor with a very low gain is irrelevant in this design. An FET of the required high resistance is obtainable as explained in the textbook "Electronic Principles; Physics, Models and Circuits" by Paul E. Gray and Campbell L. Searle of Massachusetts Institute of Technology, John Wiley & Sons, Inc., New York, 1969, especially page 354 equations (10.5) and page 355, figure 10.4., and in other standard textbooks.

Figure 6:
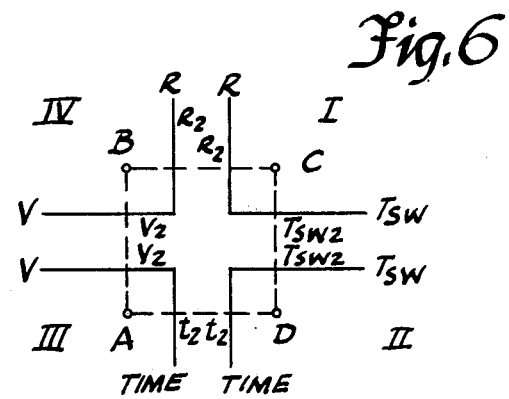
FIGS. 6–8 each comprise a set of four graphs having common axes illustrating how to determine the relation of switching temperature vs. time (quadrant II) from the known relationships of applied voltage V vs. time (quadrant III), V vs. external gate to cathode resistance R (quadrant IV), and R vs. switching temperature Tsw (quadrant I); whereafter temperature may be plotted against voltage to render the graph of FIG. 4.

The operation can be understood by plotting four graphs with four sets of common axes, FIG. 6. Quadrant I depicts switching temperature Tsw vs external gate to cathode resistance R of the thyristor of FIG. 5. Quadrant II depicts Tsw vs time during a cycle of the voltage applied across the anode 2 and cathode 4 of the thyristor of FIG. 5. Quadrant III depicts time vs. the voltage V applied across the thyristor. Quadrant IV depicts V vs R. If three of the relationships are known, then the fourth can be determined. In this case, the relationships in quadrants III, IV and I are known and the relationship in quadrant II is determined therefrom, i.e., V vs time, V vs R, and R vs Tsw are known, and Tsw vs time is determined therefrom. For example, at time $t_2$ the applied voltage is $V_2$, point A in quadrant III. At voltage $V_2$, the external gate to cathode resistance is $R_2$, point B in quadrant IV. At resistance $R_2$, the switching temperature is $Tsw_2$, point C in quadrant I (point C would be displaced to the left for higher voltages, and to the right for lower voltages). It is thus seen that starting with a given point in time during the cycle, e.g. $t_2$, one can make a horizontal projection to point A, then a vertical projection to point B, and then a horizontal projection to point C. One can then generate the fourth curve, Tsw vs time in quadrant II, by the intersection of the rightward horizontal projection from point A through $t_2$ and the downward vertical projection from point C through $Tsw_2$, whereby to render point D.

Figure 7:
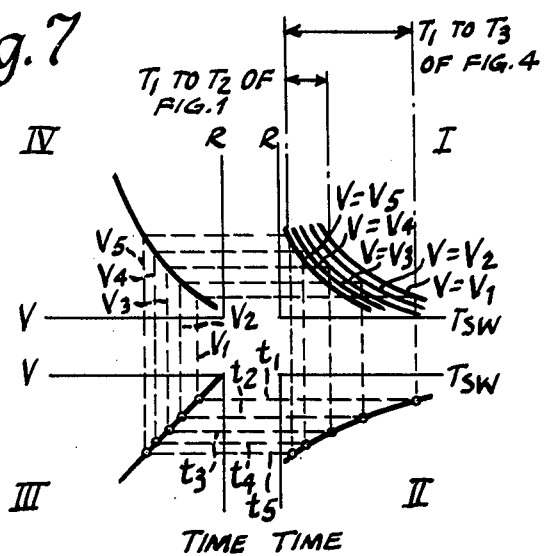

In the above manner, for a given V vs time function, which depends on the voltage source used, one can quickly determine Tsw vs time and plot its curve by connecting the points so determined, quadrant II in FIG. 7. The shape of the curve in quadrant III of FIG. 7 depends on the voltage source used. The shape of the curve in quadrant IV depends on the external resistance means used. The shape of the curve in quadrant I depends on the thyristor used.

The curve in quadrant I shifts as the applied voltage changes, thereby generating a family of curves in quadrant I with applied voltage as the parameter. For example, at time $t_1$ the applied voltage is $V_1$, quadrant III. At this voltage, the Tsw vs R curve is in the position shown in quadrant I for $V_1$. At later times $t_2$, $t_3$, etc. during the cycle, the voltage increases to $V_2$, $V_3$, etc. as shown in quadrant I. The curve in quadrant II is determined as shown by the dashed projection lines in FIG. 7.

The separation of the family of curves in quadrant I is proportional to the temperature sensitive region $T_1$ to $T_2$ of FIG. 1. The shifting of the curve in quadrant I in response to changing voltage thus gives the temperature sensitive region of FIG. 1. This shifting, however, is limited, and this in turn limits the width of the temperature sensitive region, as shown in FIG. 1. The shifting is limited because the Tsw vs R curve in quadrant I can move only as far as dictated by the change in voltage.

In the present invention, the external gate to cathode resistance R also changes and thus the horizontal projections from quadrant IV pass through different resistance values on the R axis in response to changing voltage, and hence intersect different points along the curves in quadrant I, thereby spreading out the temperature sensitive region, as shown in FIG. 4. If the external resistance R did not vary with changing voltage, then the graph in quadrant IV of FIG. 7 would be a straight horizontal line through some value of the R axis, and the width of the critical temperature sensitive region would be that dictated only by the horizontal separation of the family of curves in quadrant I. Such a width is illustrated between T1 and T2 in the curve of FIG. 1. With the present invention, however, in addition to the temperature sensitive region width enabled by the separation of Tsw vs R curves of quadrant I, there is also afforded the additional width enabled by the changing external gate to cathode resistance curve of quadrant IV. Since this V vs R curve is not a horizontal line, the corresponding values Tsw in quadrant I vary along the Tsw vs R curve. This sweeping along the Tsw vs R curve(s) gives the additional width from $T_2$ to $T_3$ of FIG. 4.

The shape of the Tsw vs time curve of quadrant II is affected by the shape of the V vs time curve of quadrant III. For example, if one wishes a linear relationship between Tsw and time, then the shape of the applied signal can be chosen as shown in quadrant III of FIG. 8.

Figure 8:
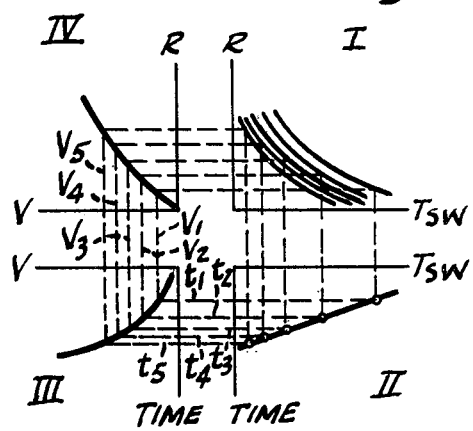

The curves in quadrants II and III of FIG. 8 have a common axis, time, and thus V can be plotted as a function of Tsw. This plot yields the graph shown in FIG. 4.

Thus it is seen that when a variable voltage V is applied from cathode to anode of the thyristor and that voltage V changes with respect to time, it shifts the curve of $T_{sw}$ vs R along the $T_{sw}$ axis so as to establish a family of $T_{sw}$ vs R curves as the value of that voltage V changes. This shift provides a portion or component of the above-described region of temperature sensitivity of the thyristor with respect to breakover voltage. The remaining portion of the region of temperature sensitivity is attributable to the widening due to the varying value of R of the resistance control means (for example, the field effect transistor) which "sweeps" the $T_{sw}$ vs R curves.

It is recognized that various modifications of the present invention are possible within the scope of the appended claims.

What is claimed is:

1. An electronic device comprising the combination of:
    a thyristor having at least (a) a gate and (b) main terminals including an anode and a cathode, said thyristor being of a type exhibiting a breakover voltage at which said thyristor intrinsically switches between nonconductive and conductive states upon application of at least said breakover voltage between said anode and cathode,
    gate resistance means having resistance R between 10 kilohms and 1 megohm, connected between said gate and one of said main terminals, and adapted to increase and decrease its resistance R in response to increases and decreases respectively in amount of voltage V applied between said anode and cathode,
    said thyristor moreover being of a type in which the value of said breakover voltage is responsive to both (1) the temperature Tsw of said thyristor at switching, said breakover voltage decreasing with increases in Tsw, and (2) the amount of said gate resistance R, said breakover voltage increasing with increases in gate resistance R;
    whereby the value of said breakover voltage is only gradually responsive to temperature, so as to widen the region of temperature sensitivity of the device as a whole.

2. An electronic device according to claim 1, and further comprising means for applying the voltage V between said anode and cathode so that V changes in a known manner with respect to time, and wherein said gate resistance means is responsive to said changing voltage V to vary R in a known manner with respect to said voltage V, such that the relationship of $T_{sw}$ vs time is determinable from the known relationships of (a) anode-to-cathode voltage V vs time, (b) R vs anode-to-cathode voltage V, and (c) $T_{sw}$ vs R, whereby the relationship of breakover voltage vs temperature of said thyristor is determinable from and controlled by said relationships of anode-to-cathode voltage V vs time and $T_{sw}$ vs time.

3. An electronic device according to claim 2 wherein said changing V is also applied to said gate resistance means such that R varies in response to changing V, to cause a shifting of the curve of $T_{sw}$ vs R along the $T_{sw}$ axis to establish a family of $T_{sw}$ vs R curves as said value of V changes,
    said shifting of said $T_{sw}$ vs R curve caused by said changing V occurring concurrently with sweeping of said $T_{sw}$ vs R curves caused by said varying R.

4. An electronic device according to claim 3 wherein said switching temperature Tsw varies linearly with respect to time.

5. An electronic device according to claim 3 wherein said resistance R of said gate resistance means comprises a field effect transistor biased by said changing V and connected between the thyristor gate and one of the main terminals of the thyristor.

6. An electronic device according to claim 5 wherein said field effect transistor has a gate connected to the thyristor anode, a source connected to the thyristor gate, and a drain connected to the thyristor cathode.

* * * * *